United States Patent
Gan

(10) Patent No.: US 6,820,248 B1
(45) Date of Patent: Nov. 16, 2004

(54) METHOD AND APPARATUS FOR ROUTING INTERCONNECTS TO DEVICES WITH DISSIMILAR PITCHES

(75) Inventor: Andy H. Gan, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 225 days.

(21) Appl. No.: 10/075,178

(22) Filed: Feb. 14, 2002

(51) Int. Cl.⁷ .............................................. G06F 17/50
(52) U.S. Cl. ............................ 716/17; 716/12; 716/16
(58) Field of Search ........................... 716/1, 7, 8, 9, 716/10, 11, 12, 13, 14, 15, 16, 17, 18

(56) References Cited

U.S. PATENT DOCUMENTS

| | | | |
|---|---|---|---|
| 4,758,985 A | 7/1988 | Carter | |
| 4,855,669 A | 8/1989 | Mahoney | |
| 5,072,418 A | 12/1991 | Boutaud et al. | |
| 5,142,625 A | 8/1992 | Nakai | |
| RE34,363 E | 8/1993 | Freeman | |
| 5,274,570 A | * 12/1993 | Izumi et al. | 716/1 |
| 5,311,114 A | 5/1994 | Sambamurthy et al. | |
| 5,339,262 A | 8/1994 | Rostoker et al. | |
| 5,347,181 A | 9/1994 | Ashby et al. | |
| 5,361,373 A | 11/1994 | Gilson | |
| 5,457,410 A | 10/1995 | Ting | |
| 5,473,267 A | 12/1995 | Stansfield | |
| 5,500,943 A | 3/1996 | Ho et al. | |
| 5,504,738 A | 4/1996 | Sambamurthy et al. | |
| 5,537,601 A | 7/1996 | Kimura et al. | |
| 5,543,640 A | 8/1996 | Sutherland et al. | |
| 5,550,782 A | 8/1996 | Cliff et al. | |
| 5,552,722 A | 9/1996 | Kean | |
| 5,574,930 A | 11/1996 | Halverson, Jr. et al. | |
| 5,574,942 A | 11/1996 | Colwell et al. | |
| 5,581,745 A | 12/1996 | Muraoka et al. | |
| 5,600,845 A | 2/1997 | Gilson | |

(List continued on next page.)

FOREIGN PATENT DOCUMENTS

| | | |
|---|---|---|
| EP | 0375275 A2 | 10/1989 |
| EP | 0 905 906 A2 | 3/1999 |
| EP | 1 235 351 A1 | 8/2002 |
| WO | WO 93 25968 A1 | 12/1993 |

OTHER PUBLICATIONS

Cary D. Snyder and Max Baron; "Xilinx's A-to-Z-System Platform"; Cahners Microprocessor; The Insider's Guide to Microprocessor Hardware; Microdesign Resources; Feb. 6, 2001; pp. 1–5.

Sayfe Kiaei et al., "VLSI Design of Dynamically Reconfigurable Array Processor-Drap" IEEE, Feb. 1989, pp. 2484–2488, V3.6, IEEE, 3 Park Avenue, 17th Floor, New York, NY 10016–5997.

Vason P, Srini, "Field Programmable Gate Array (FPGA) Implementation of Digital Systems: An Alternative to ASIC," IEEE, May 1991, pp. 309–314, IEEE, 3 Park Avenue, 17th Floor, New York, NY 10016–5997.

(List continued on next page.)

*Primary Examiner*—Vuthe Siek
*Assistant Examiner*—Binh C. Tat
(74) *Attorney, Agent, or Firm*—W. Eric Webostad

(57) ABSTRACT

Method for configuring a routing program for routing connections between an integrated circuit device and an embedded core is described. More particularly, horizontal and a vertical pitch are obtained for the integrated circuit device and the embedded core. A horizontal or a vertical pitch is selected from the embedded core to define pitch for the integrated circuit device to accommodate difference in pitch between the two. Additionally, an integrated circuit having interconnect layers using this compromise pitch are described.

28 Claims, 4 Drawing Sheets

U.S. PATENT DOCUMENTS

| | | | |
|---|---|---|---|
| 5,652,904 A | 7/1997 | Trimberger |
| 5,671,355 A | 9/1997 | Collins |
| 5,705,938 A | 1/1998 | Kean |
| 5,732,250 A | 3/1998 | Bates et al. |
| 5,737,631 A | 4/1998 | Trimberger |
| 5,740,404 A | 4/1998 | Baji |
| 5,742,179 A | 4/1998 | Sasaki |
| 5,742,180 A | 4/1998 | DeHon et al. |
| 5,748,979 A | 5/1998 | Trimberger |
| 5,752,035 A | 5/1998 | Trimberger |
| 5,760,607 A | 6/1998 | Leeds et al. |
| 5,809,517 A | 9/1998 | Shimura |
| 5,835,405 A | 11/1998 | Tsui et al. |
| 5,874,834 A | 2/1999 | New |
| 5,889,788 A | 3/1999 | Pressly et al. |
| 5,892,961 A | 4/1999 | Trimberger |
| 5,914,616 A | 6/1999 | Young et al. |
| 5,914,902 A | 6/1999 | Lawrence et al. |
| 5,933,023 A | 8/1999 | Young |
| 5,970,254 A | 10/1999 | Cooke et al. |
| 6,011,407 A | 1/2000 | New |
| 6,020,755 A | 2/2000 | Andrews et al. |
| 6,026,481 A | 2/2000 | New et al. |
| 6,096,091 A | 8/2000 | Hartmann |
| 6,154,051 A | 11/2000 | Nguyen et al. |
| 6,163,166 A | 12/2000 | Bielby et al. |
| 6,172,990 B1 | 1/2001 | Deb et al. |
| 6,178,541 B1 | 1/2001 | Joly et al. |
| 6,181,163 B1 | 1/2001 | Agrawal et al. |
| 6,211,697 B1 | 4/2001 | Lien et al. |
| 6,242,945 B1 | 6/2001 | New |
| 6,272,451 B1 | 8/2001 | Mason et al. |
| 6,279,045 B1 | 8/2001 | Muthujumaraswathy et al. |
| 6,282,627 B1 | 8/2001 | Wong et al. |
| 6,301,696 B1 * | 10/2001 | Lien et al. | 716/16 |
| 6,343,207 B1 | 1/2002 | Hessel et al. |
| 6,353,331 B1 | 3/2002 | Shimanek |
| 6,356,987 B1 | 3/2002 | Aulas |
| 6,389,558 B1 | 5/2002 | Herrmann et al. |
| 6,434,735 B1 | 8/2002 | Watkins |
| 6,460,172 B1 | 10/2002 | Insenser Farre et al. |
| 6,467,009 B1 | 10/2002 | Winegarden et al. |
| 6,483,342 B2 | 11/2002 | Britton et al. |
| 6,507,942 B1 | 1/2003 | Calderone et al. |
| 6,510,548 B1 | 1/2003 | Squires |
| 6,518,787 B1 | 2/2003 | Allegrucci et al. |
| 6,519,753 B1 | 2/2003 | Ang |
| 6,522,167 B1 | 2/2003 | Ansari et al. |
| 6,532,572 B1 * | 3/2003 | Tetelbaum | 716/4 |
| 6,539,508 B1 | 3/2003 | Patrie et al. |
| 6,541,991 B1 | 4/2003 | Hornchek et al. |
| 6,578,174 B2 | 6/2003 | Zizzo |
| 6,587,995 B1 | 7/2003 | Duboc et al. |
| 6,588,006 B1 | 7/2003 | Watkins |
| 6,601,227 B1 * | 7/2003 | Trimberger | 716/12 |
| 6,604,228 B1 * | 8/2003 | Patel et al. | 716/8 |
| 6,611,951 B1 * | 8/2003 | Tetelbaum et al. | 716/12 |
| 2001/0049813 A1 * | 12/2001 | Chan et al. | 716/8 |
| 2003/0062922 A1 | 4/2003 | Douglass et al. |

OTHER PUBLICATIONS

G. Maki et al., "A Reconfigurable Data Path Processor," IEEE, Aug. 1991, pp. 18–4.1 to 18–4.4, IEEE, 3 Park Avenue, 17th Floor, New York, NY 10016–5997.

Jacob Davidson, "FPGA Implementation of Reconfigurable Microprocessor," IEEE, Mar. 1993, pp. 3.2.1–3.2.4, IEEE, 3 Park Avenue, 17th Floor, New York, NY 10016–5997.

Christian Iseli et al., "Beyond Superscaler Using FPGA's," IEEE, Apr. 1993, pp. 486–490, IEEE, 3 Park Avenue, 17th Floor, New York, NY 10016–5997.

P.C. French et al., "A Self–Reconfiguring Processor,"; IEEE, Jul. 1993, pp. 50–59, IEEE, 3 Park Avenue, 17th Floor, New York, NY 10016–5997.

Christian Iseli et al., "Spyder: A Reconfigurable VLIW Processor Using FPGA's," IEEE, Jul. 1993, pp. 17–24, IEEE, 3 Park Avenue, 17th Floor, New York, NY 10016–5997.

Michael I. Wirthlin et al., "The Nano Processor: A Low Resource Reconfigurable Processor," IEEE, Feb. 1994, pp. 23–30, IEEE, 3 Park Avenue, 17th Floor, New York, NY 10016–5997.

William S. Carter, "The Future of Programmable Logic and Its Impact on Digital System Design," Apr. 1994, IEEE, pp. 10–16, IEEE, 3 Park Avenue, 17th Floor, New York NY 10016–5997.

Andre' Dehon, "DPGA–Coupled Microprocessors: Commodity ICs For The Early 21st Century," IEEE, Feb. 1994, pp. 31–39, IEEE, 3 Park Avenue, 17th Floor, New York, NY 10016–5997.

Osama T. Albaharna, "Area & Time Limitations of FPGA–Based Virtual Hardware," IEEE, Apr. 1994, pp. 184–189, IEEE, 3 Park Avenue, 17th Floor, New York, NY 10016–5997.

U.S. patent application Ser. No. 10/043,769, Schulz, filed Jan. 9, 2002.

U.S. patent application Ser. No. 10/001,871, Douglass et al., filed Nov. 19, 2001.

U.S. patent application Ser. No. 09/991,412, Herron et al., filed Nov. 16, 2001.

Xilinx, Inc., "The Programmable Logic Data Book," 1994, Revised 1995, Xilinx, Inc., 2100 Logic Drive, San Jose, CA. 95124.

Xilinx, Inc., "The Programmable Logic Data Book," 1994, Revised 1995, pp 2–109 to 2–117, Xilinx, Inc. 2100 Logic Drive, San Jose CA. 95124.

Xilinx, Inc., "The Programmable Logic Data Book," 1994, Revised 1995, pp 2–9 to 2–18; 2–187 to 2–199, Xilinx, Inc., 2100 Logic Drive, San Jose, CA. 95124.

Xilinx, Inc., "The Programmable Logic Data Book," 1994, Revised 1995, pp 2–107 to 2–108, Xilinx, Inc., 2100 Logic Drive, San Jose, CA. 95124.

Christian Iseli et al., "AC++ Compiler for FPGA Custom Execution Units Synthesis," 1995, pp. 173–179, IEEE, 3 Park Avenue, 17th Floor, New York, NY 10016–5997.

International business Machines, "PowerPC 405 Embedded Processor Core User Manual," 1996, 5th Ed., pp. 1–1 to X–16, International Business Machines, 1582 Rout 52, Bkdg. 504, Hopewell Junction, NY 12533–6531.

Yamin Li et al., "Aizup–A Pipelined Processor Design & Implemetnation on Xilinx FPGA Chip," IEEE, Sep. 1996, pp 98–106, 98–106, IEEE, 3 Park Avenue, 17th Floor, New York, NY 10016–5997.

Ralph D. Wittig et al., Onechip: An FPGA Processor with Reconfigurable Logic, Apr. 17, 1996, pp 126–135, IEEE, 3 Park Avenue, 17th Floor, New York, NY 10016–5997.

Xilinx, Inc., "The Programmable Logic Data Book," Jan. 27, 1999, Ch. 3, pp 3–1 to 3–50, Xilinx, Inc., 2100 Logic Drive, San Jose, CA 95124.

*William B. Andrew et al.*, "A Field Programmable System Chip Which Combines FPGA & Asic Circuitry," IEEE, May 16, 1999, pp. 183–186, IEEE, 3 Park Avenue, 17th Floor, New York, NY 10016–5997.

*Xilinx, Inc.*, "The Programmable Logic Data Book," 2000, Ch. 3 pp 3–1 to 3–117, Xilinx, Inc. 2100 Logic Drive, San Jose, CA 95124.

U.S. patent application Ser. No. 09/991,410, Herron et al., filed Nov. 16, 2001.

U.S. patent application Ser. No. 09/968,446, Douglass et al., filed Sep. 28, 2001.

U.S. patent application Ser. No. 09/917,304, Douglass et al., filed Jul. 27, 2001.

U.S. patent application Ser. No. 09/861,112, Dao et al., filed May 18, 2001.

U.S. patent application Ser. No. 09/858,732, Schulz, filed May 15, 2001.

*Xilinx, Inc.*, "The Programmable Logic Data Book," 2000, Ch. 3, pp 3–7 to 3–17; 3–76 to 3–87, Xilinx, Inc., 2100 Logic Dr., San Jose, CA. 95124.

*International Business Machines*, "Processor Local Bus" Architecture Specifications, 32–Bit Implementation, Apr. 2000, First Edition, V2.9, p. 1–76, IBM Corporation, Department H83A, P.O. Box 12195, Research Triangle Park, NC 27709.

*Xilinx, Inc.*, Virtex II Platform FPGA Handbook, Dec. 6, 2000, v1.1, pp 33–75, Xilinx, Inc., 2100 Logic Drive, San Jose, CA. 95124.

* cited by examiner

METHOD AND APPARATUS FOR ROUTING INTERCONNECTS TO DEVICES WITH DISSIMILAR PITCHES

FIELD OF THE INVENTION

The present invention relates generally to routing for devices with different pitch, and more particularly to routing of a core embedded in a programmable logic device where the core comprises a different pitch than the programmable logic device.

BACKGROUND OF THE INVENTION

Programmable logic devices exist as a well-known type of integrated circuit that may be programmed by a user to perform specified logic functions. There are different types of programmable logic devices, such as programmable logic arrays (PLAs) and complex programmable logic devices (CPLDs). One type of programmable logic devices, called a field programmable gate array (FPGA), is very popular because of a superior combination of capacity, flexibility and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

A recent development in FPGA technology involves providing FPGAs comprising a plurality of what are known as "standard cells." These "standard cells" are provided inside an FPGA as functional blocks and have a set height. Notably, the term "standard cell" is not to imply that any standard, de facto or otherwise, exists, as standard cell size may vary from company to company. So, for example, logic blocks, such as a flip-flop, a NAND gate, and an inverter, among other well-known logic circuits, each will lay out with a same height, but may have different lengths. This height is conventionally dependent on pitch of a company's integrated circuit process for one or more interconnect or metal layers. A standard cell may be made up of several logic blocks, each with a same height, but possibly with different lengths. Thus, each standard cell will have a same height but may have varying lengths. Standard cells may be assembled for providing interconnectivity logic or "glue logic." Thus, an FPGA may be connected to an embedded device to carry out complex tasks.

However, an embedded device or core may not have the same layout pitch as an FPGA. Moreover, FPGA exclusive routing over an embedded core further complicates routing to an embedded core. A placement and routing database used by a routing program creates routing for connecting an FPGA to an embedded core. However, non-equivalent pitch between such an FPGA and embedded core causes design rule violations. These design rule violations heretofore were addressed by manual re-routing. However, checking a design for such violations and manually re-routing can delay production by one or more months depending on complexity and number of connections between the FPGA and embedded core.

Accordingly, it would be desirable and useful to provide a layout rules for implementation in a placement and routing database that would reduce design rule violations owing to differences in pitch between an FPGA and an embedded core.

SUMMARY OF THE INVENTION

An aspect of the present invention is a method for configuring a routing program for routing connections between an integrated circuit device and an embedded core. More particularly, a first horizontal pitch and a first vertical pitch is obtained for one of the integrated circuit device and the embedded core, and a second horizontal pitch and a second vertical pitch is obtained for the other of the integrated circuit device and the embedded core, where the first vertical pitch and the second vertical pitch are not equal. A first connection layer input, including, but not limited to, the first vertical pitch and a horizontal direction, is provided to the routing program, and a second connection layer input, including, but not limited to, the second horizontal pitch and a vertical direction, is provided to the routing program.

An aspect of the present invention is an integrated circuit device comprising a first device coupled to a second device. The first device comprises a first horizontal pitch and a first vertical pitch. The second device comprises a second horizontal pitch and a second vertical pitch. At least one interconnect layer is for coupling the first device and the second device. The interconnect layer comprises a set of pitches selected from: (i) the first vertical pitch and the second horizontal pitch, and (ii) the first horizontal pitch and the second vertical pitch.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
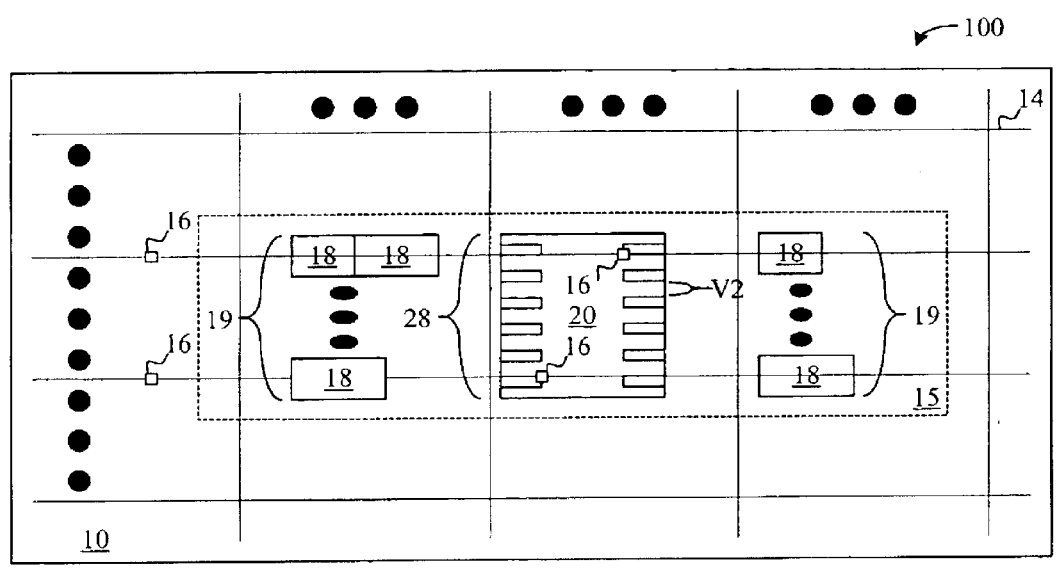
FIG. 1 is a block diagram of an exemplary embodiment of an integrated circuit comprising an FPGA, standard cells for glue logic and a microprocessor core in accordance with one or more aspects of the present invention.

Referring to FIG. 1, there is shown a block diagram of an exemplary embodiment of an integrated circuit 100 comprising an FPGA 10 and a microprocessor core 20 in accordance with one or more aspects of the present invention. Over FPGA 10 and microprocessor core 20 is grid 14. Grid 14 is shown to indicated that a plurality of metal interconnect lines are used for connecting FPGA 10 circuitry to microprocessor core 20 circuitry. As mentioned above, standard cells 19 may be used to provide glue logic to connect FPGA circuitry 10 and microprocessor core 20 circuitry. Vias or contacts 16 are formed to provide interconnection to desired locations of such circuitry and grid 14. Notably, grid 14 may comprise a plurality of interconnect layers, as described below in more detail.

Microprocessor core 20 comprises a plurality of pins 28. Because pins may be longer than contact pads as indicated by vias 16, there is more longitudinal variability for locating vias 16 to contact such pins 28. Though pins 28 are shown as having a longitudinal or horizontal orientation, they may have a latitudinal or vertical orientation or a combination of both. However, for purposes of clarity of explanation, a horizontal orientation is described.

Figure 2:
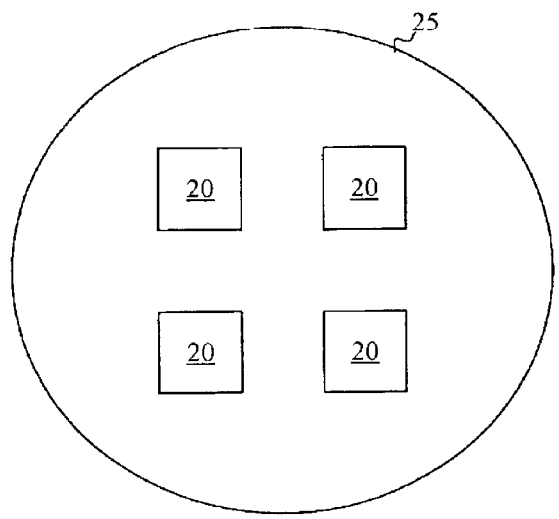
FIG. 2 is a block diagram of an exemplary embodiment of integrated circuit device cores are formed on a semiconductor wafer of the prior art.

In an embedded process, a plurality of microprocessor cores 20 is formed on a wafer 25, as shown in the block diagram of FIG. 2. Accordingly, there may be a region 15 between a microprocessor core 20 and an FPGA 10, as shown in FIG. 1, as FPGA 10 may be formed with a different process flow than microprocessor core 20. Region 15 may comprise standard cells 19 formed of one or more logic blocks 18.

FPGA 10 is built proximal to microprocessor core 20 on a same wafer 25 or other substrate member upon which microprocessor core 20 is located. However, owing to differences in processes, microprocessor core 20 may have a different pitch for one or more of its interconnect layers than that of FPGA 10. So, for example, suppose microprocessor core 20 was designed for a 0.13 micron process technology and laid out for a 0.57 micron horizontal and vertical pitch for its interconnect layers. And, suppose for example that FPGA 10 was designed for a 0.18 micron process technology and laid out for a 0.66 micron horizontal pitch and a 0.60 micron vertical pitch. Accordingly, automatic routing from microprocessor core 20 to FPGA 10 would be impracticable owing to design rule violations. To reduce such design rule violations with automatic routing, a neutral or compromise pitch set is employed.

Figure 3A:
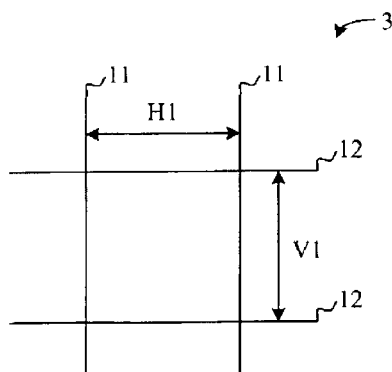
FIGS. 3A and 3B are line diagrams of respective exemplary portions of interconnect layers from the FPGA and the microprocessor core of FIG. 1.
Figure 3B:
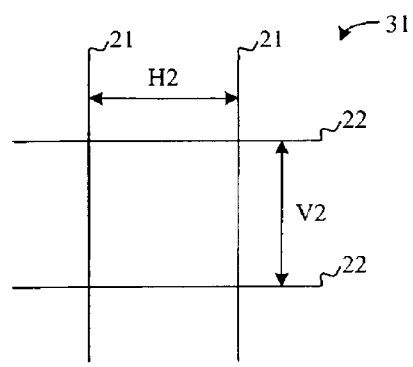

Continuing the above example, reference is made to FIGS. 3A and 3B, where shown are line diagrams of respective exemplary portions of 30 and 31 of interconnect layers from FPGA 10 and microprocessor core 20, respectively, of FIG. 1. Grid portion 30 comprises vertical conductive lines 11 and horizontal conductive lines 12. Spacing between vertical conductive lines 11 is horizontal pitch H1, and spacing between horizontal conductive lines 12 is vertical pitch V1. Grid portion 31 comprises vertical conductive lines 21 and horizontal conductive lines 22. Spacing between vertical conductive lines 21 is horizontal pitch H2, and spacing between horizontal conductive lines 22 is vertical pitch V2. Continuing the above example, H1 and V1 are 0.66 microns and 0.60 microns, respectively, and H2 and V2 are each 0.57 microns.

Figure 4:
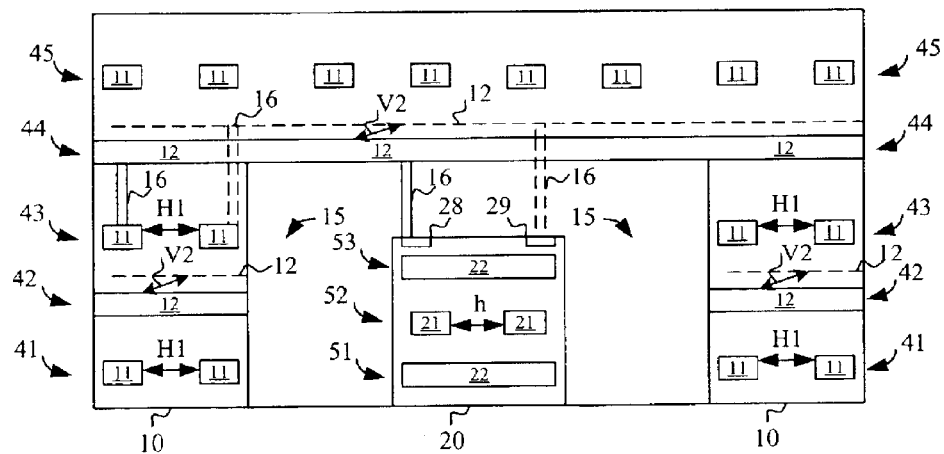
FIG. 4 is a cross-sectional diagram of exemplary portions of the FPGA and the microprocessor core of FIG. 1.

Referring to FIG. 4, there is shown a cross-sectional diagram of exemplary portions of FPGA 10 and microprocessor core 20 of FIG. 1. FPGA 10 is shown with five interconnect layers 41, 42, 43, 44 and 45, though fewer or more interconnect layers may be used. Microprocessor core 20 is shown with three interconnect layers 51, 52 and 53, though fewer or more interconnect layers may be used. Region 15 may comprise standard cells or a filler material, such as a dielectric, or a combination thereof.

Vias 16 are shown connecting pins 28 to conductive lines 11 and 12. Notably, pins 28 are conventionally connected to at least one of lines 21 and 22, though not shown here for purposes of clarity. Moreover, spacing or vertical pitch of pins 28 is V2, as shown in FIG. 1.

As shown, a compromise pitch is used for interconnect layers 42 and 44, namely, V2, which is the vertical pitch used for microprocessor core 20 conductive lines 22 and pins 28. However, interconnect layers 41, 43 and 45 use a horizontal pitch H1 from FPGA 10 layout. In this manner, interconnect layers 42 and 44 are on vertical pitch V2 with pins 28 for connection thereto. This facilitates connecting to pins 28 without off-line line routing, namely, routing in between conductive lines, and thus reduces likelihood of design rule spacing violations. Moreover, if pins 28 form a bus, multiple vias 16 may be used to connect to pins 28 to provide bus connectivity.

Notably, FPGA 10 retains horizontal pitch H1 for layers 41, 43 and 45. This facilitates not violating design rules for FPGA 10. Moreover, as conductive lines of interconnect layers 41, 43 and 45 are not parallel with conductive lines of interconnect layers 42 and 45, vias 16 may couple conductive lines 11 and 12 without violating design rules.

Figure 5:
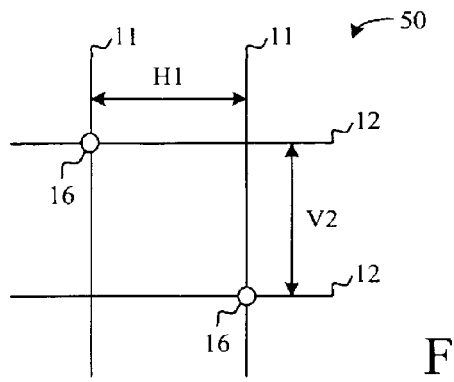
FIG. 5 is a line diagram of an exemplary portion of an interconnect layer from the FPGA of FIG. 1 in accordance with an aspect of the present invention.

Referring to FIG. 5, there is shown a line diagram of an exemplary portion 50 of an interconnect layer from FPGA 10 in accordance with an aspect of the present invention. Conductive lines 12 have a vertical pitch of V2, and conductive lines 11 have a horizontal pitch of H1. However, depending on orientation of pins 28 of FIG. 1, H1 may need to be substituted for H2. Thus, the present invention may be used to provide a pitch set (V1, H2) for FPGA 10. Moreover, if both vertically and horizontally oriented pins are present, then a plurality of interconnect layers of one pitch set (V1, H2) are used for the vertically oriented pins, and another plurality of interconnect layers of another pitch set (V2, H1) are used for the horizontally oriented pins.

Notably, substitution of either V1 or H1 with V2 or H2 for FPGA 10 layout and routing is used for interconnect layers, namely, layers for interconnecting microprocessor core 20 to FPGA 10. Though these interconnect layers may be used for FPGA location to FPGA location connectivity, other layers not used for interconnecting FPGA 10 to microprocessor core 20 may be present.

Figure 6:
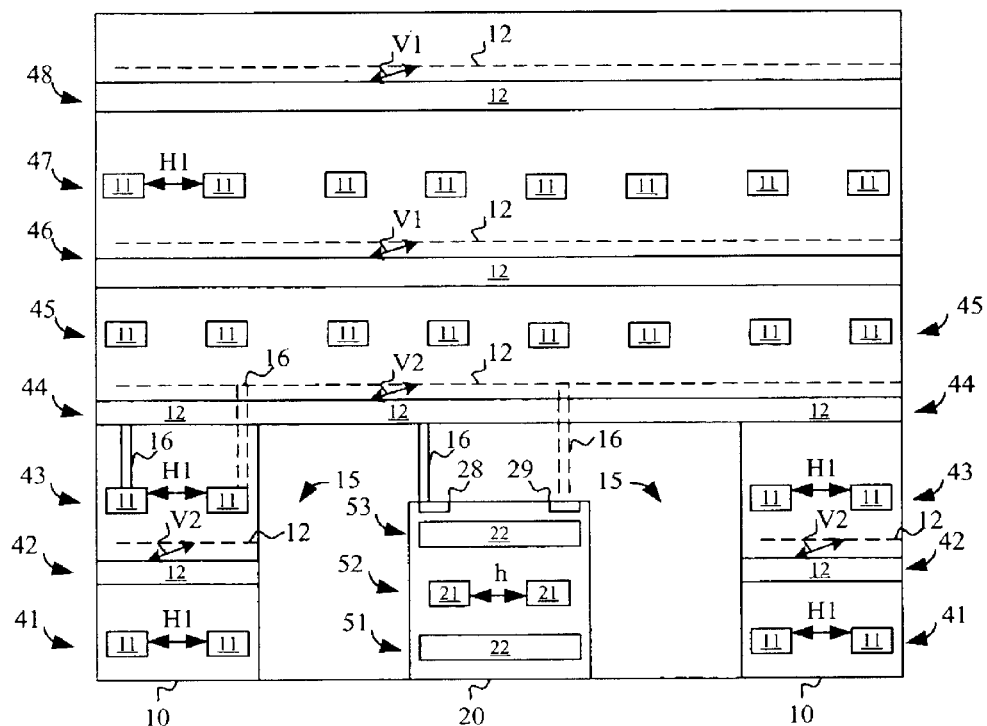
FIG. 6 is a cross-sectional diagram of an exemplary portion of the FPGA and the microprocessor core of FIG. 1.

Referring to FIG. 6, there is shown a cross-sectional diagram of an exemplary portion of FPGA 10 and microprocessor core 20 in accordance with one or more aspects of the present invention. Metal layers 46, 47 and 48 are shown above interconnect layer 45. Metal layers 46, 47 and 48 comprise pitches H1 and V1. Use of FPGA 10 native pitches for non-interconnect layers to microprocessor core 20 facilitates automatic routing without design rule spacing violation.

Input to a conventional automatic routing program is done for each layer. With renewed reference to FIG. 5, inputs for an automatic routing program for each interconnect layer shown for FPGA 10 are set forth in Table I.

TABLE I

| Layer Ref. No. | Pitch | Direction |
| --- | --- | --- |
| 41 | H1 | Vertical |
| 42 | V2 | Horizontal |
| 43 | H1 | Vertical |
| 44 | V2 | Horizontal |
| 45 | H1 | Vertical |

Figure 7:
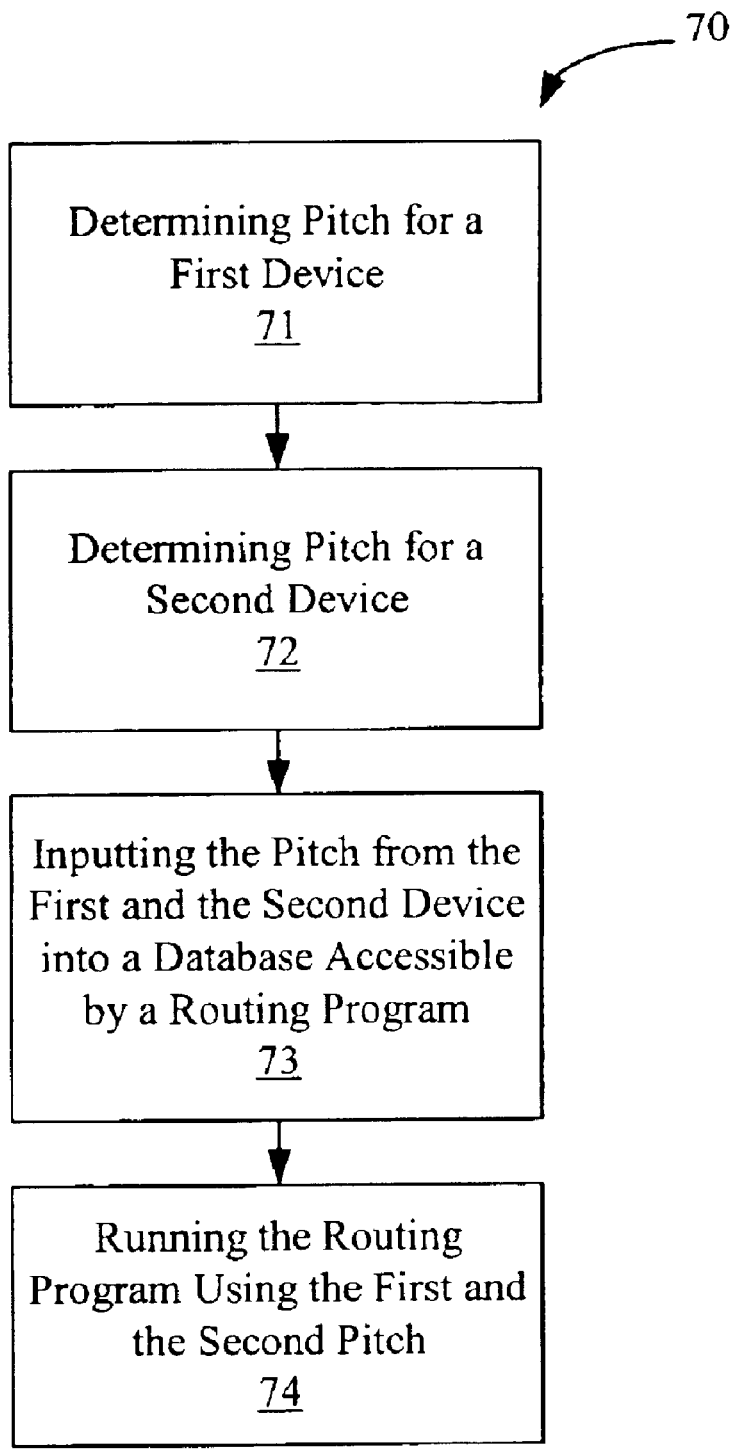
FIG. 7 is a flow diagram of an exemplary embodiment of a process in accordance with one or more aspects of the present invention

Referring to FIG. 7, there is shown a flow diagram of an exemplary embodiment of a process 70 in accordance with one or more aspects of the present invention. At step 71, pitch from a first device is obtained or determined. At step 72, pitch from a second device is obtained. At step 73, pitch from the first device and pitch from the second device are provided to a database accessible by a routing program. And, at step 74, the routing program is run using the pitch from the first device and the second device.

Though exemplary pitches were described above, it should be understood that the present invention is not so limited. Conventionally, horizontal and vertical pitches vary depending at least in part on lithography. However, it should be appreciated that the present invention scales with lithography, and thus the present invention may be employed in semiconductor processes for embedding a core device into another device where both devices are designed to be manufactured using submicron lithographic processes.

While foregoing is directed to the preferred embodiment of the present invention, other and further embodiments of the invention may be devised without departing from the basic scope thereof, and the scope thereof is determined by the claims that follow. For example, though the present invention is described in terms of an FPGA and embedded processor core, it should be understood that constructs other than an FPGA and an embedded processor core may be used, including, but not limited to, combinations formed from at least two of a programmable logic device, a memory, an Application Specific Integrated Circuit, an Application Specific Standard Product, a Digital Signal Processor, a microprocessor, a microcontroller, and the like.

All trademarks are the respective property of their owners.

What is claimed is:

1. A method for configuring a routing program for routing connections between an integrated circuit device and an embedded core, comprising:

obtaining a first horizontal pitch and a first vertical pitch for one of the integrated circuit device and the embedded core;

obtaining a second horizontal pitch and a second vertical pitch for the other of the integrated circuit device and the embedded core, the first vertical pitch and the second vertical pitch being different;

inputting a first connection layer input to the routing program, the first connection layer input including the first vertical pitch and a horizontal direction; and inputting a second connection layer input to the routing program, the second connection layer input including the second horizontal pitch and a vertical direction.

2. The method of claim 1 wherein the one of the integrated circuit device and the embedded core is a programmable logic device.

3. The method of claim 2 wherein the other of the integrated circuit device and the embedded core is a microprocessor core.

4. The method of claim 3 wherein the programmable logic device is a field programmable gate array.

5. The method of claim 4 wherein the field programmable gate array and the microprocessor core are formed as separate integrated circuits which are interconnected, the field programmable gate array having a first plurality of metal layers, the microprocessor core having a second plurality of metal layers, at least one layer of the first plurality of metal layers having the first horizontal pitch and the first vertical pitch, and at least one layer of the second plurality of metal layers having the second horizontal pitch and the second vertical pitch.

6. A method for configuring a routing program for routing to an integrated circuit device having an embedded core, comprising:

providing a first horizontal pitch and a first vertical pitch for one of the integrated circuit device and the embedded core;

providing a second horizontal pitch and a second vertical pitch for the other of the integrated circuit device and the embedded core, the first horizontal pitch and the second horizontal pitch being different;

inputting a first connection layer input to the routing program, the first connection layer input including the first horizontal pitch and a vertical direction; and inputting a second connection layer input to the routing program, the second connection layer input including the second vertical pitch and a horizontal direction.

7. The method of claim 6 wherein the one of the integrated circuit device and the embedded core is a programmable logic device.

8. The method of claim 7 wherein the other of the integrated circuit device and the embedded core is a microprocessor core.

9. The method of claim 8 wherein the programmable logic device is a field programmable gate array.

10. The method of claim 9 wherein the field programmable gate array and the microprocessor core are formed as separate integrated circuits which are interconnected, the field programmable gate array having a first plurality of metal layers, the microprocessor core having a second plurality of metal layers, at least one layer of the first plurality of metal layers having the first horizontal pitch and the first vertical pitch, and at least one layer of the second plurality of metal layers having the second horizontal pitch and the second vertical pitch.

11. An integrated circuit device, comprising:

a first device coupled to a second device;

the first device comprising a first horizontal pitch and a first vertical pitch;

the second device comprising a second horizontal pitch and a second vertical pitch; and at least one interconnect layer for coupling the first device and the second device, the interconnect layer comprising a set of pitches selected from:

(i) the first vertical pitch and the second horizontal pitch; and (ii) the first horizontal pitch and the second vertical pitch.

12. The integrated circuit device of claim 11 further comprising a plurality of logic blocks for interconnecting the first device and the second device.

13. The integrated circuit of claim 12 wherein the first device is a programmable logic device.

14. The integrated circuit of claim 13 wherein the programmable logic device is a field programmable gate array.

15. The integrated circuit of claim 13 wherein the second device is a microprocessor core.

16. The integrated circuit of claim 15 wherein the microprocessor core is embedded in the programmable logic device.

17. The integrated circuit of claim 16 wherein the programmable logic device comprises more metal interconnect layers than the microprocessor core.

18. The integrated circuit of claim 11 wherein the second device comprises a plurality of pins for interconnection thereto.

19. The integrated circuit of claim 11 wherein the interconnect layer was routed using a routing program having as inputs the set of pitches.

20. The integrated circuit of claim 19 wherein the set of pitches is divided for input to the routing program, wherein one pitch in the set of pitches is for one metal layer and the other pitch in the set of pitches is for another metal layer.

21. A system, comprising:
  an external memory circuit having one or more configuration data output terminals; and
  a programmable logic device (PLD), the PLD comprising:
    a programmable logic portion having a first vertical pitch and a first horizontal pitch;
    an internal configuration memory having one or more configuration data input terminals coupled to the configuration data output terminals of the external memory circuit, and further having output terminals coupled to the programmable logic portion of the PLD;
    an embedded core having a second vertical pitch and a second horizontal pitch, wherein the first vertical pitch and the second vertical pitch are different; and
    a first interconnect layer coupled between the programmable logic portion of the PLD and the embedded core, the first interconnect layer having a set of pitches selected from:
      (i) the first vertical pitch and the second horizontal pitch; and
      (ii) the first horizontal pitch and the second vertical pitch.

22. The system of claim 21, wherein the external memory circuit comprises one of a group of integrated circuits comprising: an EEPROM, an EPROM, and a PROM.

23. The system of claim 21, wherein the programmable logic portion of the PLD is a field programmable gate array (FPGA).

24. The system of claim 21, wherein the embedded core is a microprocessor.

25. The system of claim 21, wherein the interconnect layer was routed using a routing program having as an input the set of pitches.

26. The system of claim 25, wherein the PLD comprises a second interconnect layer coupled between the programmable logic portion of the PLD and the embedded core.

27. The system of claim 26, wherein the set of pitches is divided for input to the routing program, wherein one pitch in the set of pitches is used for the first interconnect layer and the other pitch in the set of pitches is used for the second interconnect layer.

28. The system of claim 21, wherein the first horizontal pitch and the second horizontal pitch are also different.

* * * * *